Figure 1:
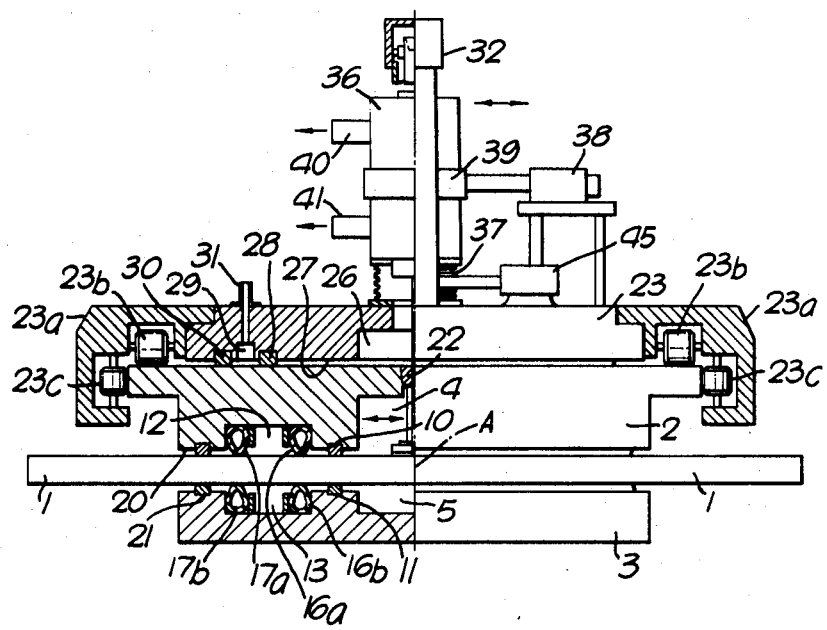

United States Patent [19]

Kihara et al.

[11] 4,080,526
[45] Mar. 21, 1978

[54] ELECTRON BEAM MACHINING APPARATUS OF THE DYNAMIC SEAL TYPE

[75] Inventors: Shiso Kihara, Akashi; Hiroshi Kono; Masaharu Minami, both of Kobe; Masaru Higuchi, Takasago, all of Japan

[73] Assignee: Mitsubishi Jukogyo Kabushiki Kaisha, Tokyo, Japan

[21] Appl. No.: 762,402

[22] Filed: Jan. 26, 1977

[30] Foreign Application Priority Data

Feb. 5, 1976 Japan ............................. 51-12362[U]

[51] Int. Cl.² .................................................. B23K 9/00
[52] U.S. Cl. ............................................. 219/121 EB
[58] Field of Search ............... 219/121 EB, 121 EM, 219/72

[56] References Cited

U.S. PATENT DOCUMENTS

| | | | |
|---|---|---|---|
| 3,465,119 | 9/1969 | Larson | 219/121 EB |
| 3,466,487 | 9/1969 | Davis et al. | 219/121 EB |
| 3,588,463 | 6/1971 | Best | 219/121 EB |
| 3,748,432 | 7/1973 | Bosworth | 219/121 EB |

FOREIGN PATENT DOCUMENTS 419,378  2/1967  Switzerland ................. 219/121 EB

*Primary Examiner*—J. V. Truhe
*Assistant Examiner*—Fred E. Bell
*Attorney, Agent, or Firm*—Wenderoth, Lind & Ponack

[57] ABSTRACT

Electron beam machining apparatus of the dynamic seal type, characterized by upper and lower fixed plates for fixedly clamping a workpiece therebetween, which plates define upper and lower vacuum chambers; a movable plate disposed on said upper fixed plate so as to be movable in the working direction, said plate defining a movable chamber which communicates with said upper vacuum chamber, said upper and lower vacuum chambers and the movable chamber providing a working chamber of the apparatus; inflatable seal members for said upper and lower vacuum chambers; said upper and lower plates defining auxiliary vacuum chambers located outwardly of and encircling their respective fixed vacuum chambers, an upper wall of said upper vacuum chamber defining an opening in the form of a V-shaped groove which extends in the working direction of V-belt seal, and by a belt seal guide tube mounted on said movable plate and extending in the working direction, to enclose the electron gun, said V-belt fitting into said groove in front of and to the rear of said guide tube, but passing upwardly out of the vacuum chamber and through said guide tube whereby an effective seal is maintained around the electron gun during movement of the movable plate for a machining operation.

3 Claims, 2 Drawing Figures

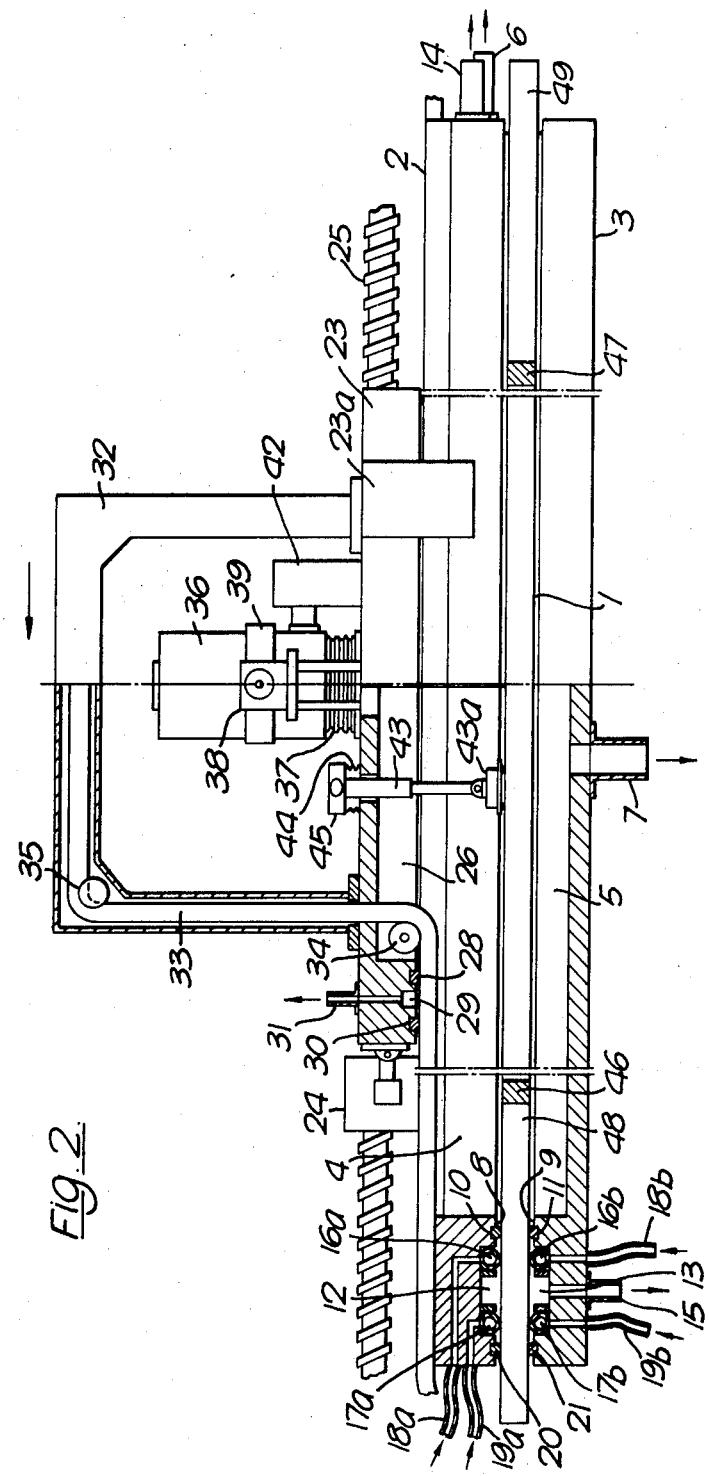

ELECTRON BEAM MACHINING APPARATUS OF THE DYNAMIC SEAL TYPE

The present invention relates to electron beam machining apparatus of the dynamic seal type, in which a degree of vacuum within a vacuum working chamber is enhanced by seal means adaptable for unevenness such as undulations of a surface of a workpiece, and in which an electron beam is adapted to follow an outline traced on said workpiece.

Many advantages are obtained by the use of electron beam machining in that, for example, hole, grooves, slits etc which could not be produced by other methods, can be made quickly and accurately. Also, if electron beam machining is applied to welding, then welds having excellent mechanical properties and corrosion-resistance can be obtained because the welding operation is conducted under conditions of high vacuum; welding of thin plates and foils which could not be accomplished by other known welding methods can also be achieved, inclusions of bubbles and a slug are eliminated, and high melting point materials can also be welded. Recently, electron beam machining has been widely employed because of the above-described advantages. One example of electron beam welding apparatus used for such material is of the dynamic seal type, to which the present invention is directed. In this type of welding apparatus, welding is conducted while moving an electron beam gun and a dynamic seal is used to seal a movable vacuum chamber surrounding the electron gun and fixed seals are used to seal fixed vacuum chambers enclosing workpieces to be welded; the effectiveness of these seals has a direct influence on the degree of vacuum in the welding chamber consisting of the respective vacuum chambers, and as a result, they can sometimes affect the welding operation itself. Especially, in cases where welding of long members is required, if conventional gaskets are employed to seal the welding chamber, said gaskets cannot be adapted readily to the undulations of the surface of the workpiece, so that the sealing may become defective. Also, in cases of long workpieces, the trace to be welded need not be straight, but it can take any shape. In such cases, due attention must be paid so that an electron beam may precisely irradiate the proposed weld. However, in previously known dynamic seal type electron beam welding apparatus, such precision was achieved merely by relying upon the skill of the operator.

An object of the present invention is to provide a dynamic seal type electron beam machining apparatus in which the above-mentioned disadvantages are eliminated or at least greatly reduced, and in which because of seal means well adapted to undulations in the surface of the workpiece as well as auxiliary vacuum chambers provided around the welding chamber, the evacuation time can be shortened and the sealing effectiveness for the welding chamber can be enhanced. Another object is to provide for the electron beam to accurately follow an outline traced on the workpiece, whereby processes such as welding, flame-cutting, etc., can be achieved with a high degree of precision.

According to this invention, electron beam machining apparatus is characterised by upper and lower fixed plates for fixedly clamping a workpiece therebetween, which plates define upper and lower vacuum chambers; a movable plate disposed on said upper fixed plate so as to be movable in the working direction, said plate defining a movable chamber which communicates with said upper vacuum chamber, said upper and lower vacuum chambers and the movable chamber providing a working chamber of the apparatus; inflatable seal members for said upper and lower vacuum chambers; said upper and lower plates defining auxiliary vacuum chambers located outwardly of and encircling their respective fixed vacuum chambers, an upper wall of said upper vacuum chamber defining an opening in the form of a V-shaped groove which extends in the working direction a V-belt seal, and by a belt seal guide tube mounted on said moveable plate and extending in the working direction, to enclose the electron gun, said V-belt fitting into said groove in front of and to the rear of said guide tube, but passing upwardly out of the vacuum chamber and through said guide tube whereby an effective seal is maintained around the electron gun during movement of the movable plate for a machining operation.

Preferably, a position detector is located so as to be positioned working chamber and arranged so as to traverse the workpiece in directions at right angles to the working direction, said position detector being operable to adjust said electron gun whereby to follow an outline traced on said workpiece.

In order that the invention will be readily understood and further features made apparent one preferred embodiment thereof will now be described with reference to the accompanying drawings, in which:

FIG. 1 is a front elevation half in cross-section of the preferred embodiment of electron beam apparatus; and FIG. 2 is a side elevation, half in cross-section of the apparatus of FIG. 1.

Referring to FIGS. 1 and 2, a workpiece 1 is fixedly supported in the apparatus by an upper fixed plate 2 and a lower fixed plate 3, which plates clamp said workpiece 1 on both its upper and lower surfaces. An upper vacuum chamber 4 and a lower vacuum chamber 5 which surround said workpiece 1 on both its upper and lower surfaces are respectively formed in the upper and lower fixed plates 2 and 3. An evacuation pipe 6 (see FIG. 2) to be connected to a vacuum pump (not shown) for evacuating said upper vacuum chamber 4 is mounted on a side surface of said upper fixed plate 2, and an evacuation pipe 7 is mounted in a similar manner on a bottom surface of the lower fixed plate 3. Both said upper and lower vacuum chambers 4 and 5 are sealed by gaskets 10 and 11 provided along contact surfaces 8 and 9 between both the upper and lower fixed plates 2 and 3 and said workpiece 1 and surrounding both said vacuum chambers 4 and 5. Outside of the gaskets 10 and 11 are respectively formed upper and lower auxiliary vacuum chambers 12 and 13 surrounding both said upper and lower vacuum chambers 4 and 5 along their entire peripheries. These upper and lower auxiliary vacuum chambers 12 and 13 are evacuated through evacuation pipes 14 and 15, respectively, mounted on the upper fixed plate 2 and on the lower fixed plate 3. Both the upper and lower auxiliary vacuum chambers 12 and 13 are sealed by inner tubular inflatable seals 16a and 16b and outer tubular inflatable seals 17a and 17b provided on the respective sides of these auxiliary vacuum chambers. The inner and outer inflatable seals 16a, 16b and 17a, 17b respectively are inflated by air supplied through air feed pipes 18a, 18b and 19a, 19b, mounted on the upper fixed plate 2 and on the lower fixed plate 3 respectively, so that they can adapt themselves to any unevenness, such as undulations in the surface of the workpiece 1. Gaskets 20 and 21 are also provided outside of said outer inflatable seals 17a and 17b. Accordingly, both the upper and lower vacuum chambers 4 and 5 are sealed fourfold. The upper wall of the upper vacuum chamber 4 opens through a V-shaped groove 22 which is formed in a straight line in the longitudinal direction (i.e. the direction of working). A plate 23 is provided on the fixed upper plate 2, which is movable in the working direction by means of a lead screw 25 from a driving device 24, which is mounted on a front surface of said plate 23. This movable plate 23 is accurately guided in the working direction by means of guide rollers 23b which traverse the upper surface of said upper fixed plate 2 and guide rollers 23c which traverse the side surfaces of the upper fixed plate 2 and which are supported by guide roller mounts 23a secured to the opposite side surfaces of said movable plate 23. A movable vacuum chamber 26 which communicates with said upper vacuum chamber 4 through said V-shaped groove 22 is formed in the movable plate 23. It is to be noted that the working chamber of the apparatus comprises both said upper and lower vacuum chambers 4 and 5 and the movable vacuum chamber 26. The movable vacuum chamber 26 is sealed by a gasket 28 provided along a surface 27 of the movable plate 23 opposed to said upper fixed plate 2 and surrounding said movable vacuum chamber 26. An auxiliary vacuum chamber 29 is formed outside of the gasket 28, which is sealed by said gasket 28 and another gasket 30 provided outwardly of said auxiliary vacuum chamber 29. Accordingly, the movable vacuum chamber 26 is double sealed by the gaskets 28 and 30. The auxiliary vacuum chamber 29 is evacuated through an evacuation pipe 31 is mounted on the top surface of the movable plate 23. A belt seal guide tube 32 of inverted U-shape is disposed on the plate 23 with its bridge portion directly above said V-shaped groove 22 and extending parallel to the working direction. The interior of the belt seal guide tube 32 communicates with the interior of said movable vacuum chamber 26 at both the front and rear upright portions of said belt seal guide tube 32 where they connect to the movable plate 23 (see FIG. 2). A V-belt seal 33 which fits in the V-shaped groove 22 in the upper wall of said upper vacuum chamber 4 for sealing the upper vacuum chamber 4 and the movable vacuum chamber 26, is introduced into the front upright portion of the belt seal guide tube 32 by means of a guide roller 34 mounted within said movable vacuum chamber 26, then led, via a guide roller 35 along the bridge portion, down through the rear upright portion of said tube and then back into the vacuum chamber 26 where it again fits into said V-shaped groove 22. Accordingly, said movable vacuum chamber 26 can be effectively sealed, even while moving in accordance with the motion of the movable plate 23. An electron gun 36 is mounted on the movable plate 23 via the intermediary of a flexible member, which is in the form of a bellows 37 in the illustrated embodiment, and this member is connected to an electron gun driving device 38 fixed on the movable plate 23 via a clamp 39. The interior of the electron gun 36 communicates with said vacuum chamber 26, and is evacuated through evacuation pipes 40 and 41 mounted on said electron gun. The electron gun 36 is connected to a wire feed device 42 which operates simultaneously with said electron gun driving device 38. This wire feed device 42 supplies the voltage and current necessary for generating the electron beam. A position detector 43 is also mounted on the plate 23 for detecting the position of the trace on the workpiece 1, via bellows 44 located just in front of the electron gun 36, and the detector probe 43a of the detector 43 is located within the upper vacuum chamber 4 as shown in FIG. 2, and is operable to traverse the workpiece 1 in the working direction. The upper portion of the position detector 43 is coupled to a driving device 45 so that the position detector 43 can be moved to the left or right (at right angles to the direction of working) so as to follow the trace line on the workpiece 1 while it is moving along the V-shaped groove 22 in accordance with the motion of the movable plate 23. Said electron gun driving device 38 drives the electron gun 36 in accordance with a detection signal emitted from the position detector 43, so that the emitted electron beam follows the trace on the workpiece 1.

One example of a welding operation making use of the apparatus described above will now be discussed.

A workpiece 1 is clamped between the upper fixed plate 2 and the lower fixed plate 3, and is fixed in such manner that the proposed weld "A" is positioned directly beneath the electron gun 36. In cases where the proposed weld "A" is shorter than the length of both the upper and lower vacuum chambers 4 and 5, end surface seals 46 and 47 are provided at the front and rear of the workpiece 1 and these end surface seals 46 and 47 are urged from their front and rear sides by means of pressure plates 48 and 49 (see FIG. 2) so as to enclose a sealed volume and thereby enable both upper and lower vacuum chambers 4 and 5, to be evacuated. In cases where the width of the workpiece 1 is narrower than the width of both the upper and lower vacuum chambers 4 and 5 the same result can be achieved by employing similar end surface seals and pressure plates. Once the workpiece 1 has been fixed in position, then both the inner and outer inflatable seals 16a, 16b, and 17a, 17b are inflated by their respective air feed pipes 18a, 18b, 19a and 19b, so that said seals adhere tightly to the upper and lower surfaces of the workpiece 1 or the upper and lower surfaces of the pressure plates 48 and 49. Thereby both the upper and lower vacuum chambers 4 and 5 and both the upper and lower auxiliary vacuum chambers 12 and 13 are effectively sealed. Simultaneously with evacuation of both the upper and lower auxiliary vacuum chambers 12 and 13 and the auxiliary vacuum chamber 29, the working or welding chamber comprising the upper and lower vacuum chambers 4 and 5 and the movable vacuum chamber 26, is evacuated. Since the upper vacuum chamber 4 and the lower vacuum chamber 5 are respectively provided with the auxiliary vacuum chambers 12 and 13 outside thereof, they can be easily evacuated, and further, since they are sealed in a fourfold manner, a high degree of vacuum can be attained. The same is also true with respect to the movable vacuum chamber 26. After the interior of the welding chamber has reached a predetermined degree of vacuum, the movable plate 23 is urged in the direction of welding by operating the driving device 24. During this period, the detector probe 43a of the position detector 43 located on the line to be welded, detects the trace and moves along it. A position detection signal generated in response to the motion of the position detector 43 is fed to the electron gun driving device 38, and this device adjusts the electron gun 36 so that the electron beam emitted from the electron gun 36 may accurately irradiate along the proposed weld line. During motion of the movable plate 23, the V-belt seal 33 is withdrawn from the V-shaped groove 22 at the front of the movable plate 23, and is re-fitted into the V-shaped groove 22 at the rear of the movable plate 23, so that even during the welding operation itself, the vacuum within the welding chamber can always be maintained. Jointly with the electron gun driving device 38, the wire feed device 42 ensures the continuing supply of the welding current for generating the electron beam.

In the described embodiment, said V-belt seal 33 automatically fits into the V-shaped groove due to the pressure difference between atmospheric pressure and the vacuum created, and due to the wedge effect thereof, a large pressure bears upon the surfaces between the upper fixed plate 2 and the workpiece 1 mounted thereupon. Thus, an effective seal can be maintained. In the case where said V-belt seal 33 is made of rubber, due to its elasticity, an effective seal is assured by contact pressure of the gasket mounted upon the movable vacuum chamber 26, even if the surface of the upper fixed plate 2 does not fit flush with that of said V-belt seal 33.

It will be appreciated that since the belt tube 32 is of inverted U-shape and passes over the electron gun 36, movement of the V-belt seal 33 can be carried out smoothly, and there is no danger that excessive forces may act upon said V-belt seal 33.

As mentioned above, the example described is for a welding operation accomplished by apparatus according to the present invention. However, other operations or processes, such as flame-cutting, hole forming, etc, can be also accomplished by apparatus according to the present invention. In the case of hole forming, it is only necessary to irradiate the workpiece intermittently with an electron beam.

As described in detail above in connection with the preferred embodiment, with a dynamic seal type electron beam machining apparatus according to the present invention, since auxiliary vacuum chambers are formed around the respective vacuum chambers comprising the working chamber, and further, since these vacuum chambers are sealed by means of a plurality of seal members, the time to evacuate the interior of the working chamber can be shortened and the effectiveness of the seals can be enhanced compared with known apparatus of this type. Furthermore, since provision is made for the electron gun to be driven while following an outline in response to the detector for detecting the position of a trace on the workpiece, there is an advantage in that any shape of welding line can be followed precisely.

We claim:

1. Electron beam machining apparatus of the dynamic seal type, characterised by upper and lower fixed plates for fixedly clamping a workpiece therebetween, which plates define upper and lower vacuum chambers; a movable plate disposed on said upper fixed plate so as to be movable in the working direction, said plate defining a movable chamber which communicates with said upper vacuum chamber, said upper and lower vacuum chambers and the movable chamber providing a working chamber of the apparatus; inflatable seal members for said upper and lower vacuum chambers; said upper and lower plates defining auxiliary vacuum chambers located outwardly of and encircling their respective fixed vacuum chambers, an upper wall of said upper vacuum chamber defining an opening in the form of a V-shaped groove which extends in the working direction a V-belt seal, and by a belt seal guide tube mounted on said moveable plate and extending in the working direction, to enclose the electron gun, said V-belt fitting into said groove in front of and to the rear of said guide tube, but passing upwardly out of the vacuum chamber and through said guide tube whereby an effective seal is maintained around the electron gun during movement of the movable plate for a machining operation.

2. Electron beam machining apparatus according to claim 1, further characterised by a position detector located so as to be positioned within said working chamber and arranged so as to traverse the workpiece in directions at right angles to the working direction, said position detector being operable to adjust said electron gun whereby to follow an outline traced on said workpiece.

3. Electron beam machining apparatus according to claim 2, further characterised by the position detector being mounted on said movable plate.

* * * * *